US008736631B2

(12) United States Patent
Mukai et al.

(10) Patent No.: US 8,736,631 B2
(45) Date of Patent: May 27, 2014

(54) FACILITY OPERATION DISPLAY DEVICE, AIR-CONDITIONING SYSTEM, AND NON-TRANSITORY COMPUTER-READABLE MEDIUM

(75) Inventors: Takuya Mukai, Tokyo (JP); Masanori Nakata, Tokyo (JP); Yoshiaki Koizumi, Tokyo (JP); Makoto Katsukura, Tokyo (JP); Noriyuki Kushiro, Tokyo (JP)

(73) Assignee: Mitsubishi Electric Corporation, Chiyoda-Ku, Tokyo (JP)

( * ) Notice: Subject to any disclaimer, the term of this patent is extended or adjusted under 35 U.S.C. 154(b) by 103 days.

(21) Appl. No.: 13/384,488

(22) PCT Filed: Jun. 2, 2010

(86) PCT No.: PCT/JP2010/059394

§ 371 (c)(1),
(2), (4) Date: Jan. 17, 2012

(87) PCT Pub. No.: WO2011/007623

PCT Pub. Date: Jan. 20, 2011

(65) Prior Publication Data

US 2012/0120092 A1 May 17, 2012

(30) Foreign Application Priority Data

Jul. 17, 2009 (JP) ................................ 2009-169592

(51) Int. Cl.

| | |
|---|---|
| ***G09G 5/00*** | (2006.01) |
| ***G09G 5/02*** | (2006.01) |
| ***G09G 5/10*** | (2006.01) |
| ***G09G 5/36*** | (2006.01) |
| ***G03F 3/08*** | (2006.01) |
| ***H04N 1/46*** | (2006.01) |
| ***G06K 9/00*** | (2006.01) |
| ***G06K 9/40*** | (2006.01) |
| ***G06F 12/00*** | (2006.01) |
| ***G06T 5/00*** | (2006.01) |

(52) U.S. Cl.
CPC . *G09G 5/02* (2013.01); *G06T 5/001* (2013.01)
USPC ........... 345/589; 345/594; 345/601; 345/690; 345/519; 345/549; 358/518; 358/525; 382/167; 382/254; 711/100; 711/221

(58) Field of Classification Search
USPC .................... 62/125–127; 345/581, 589–591, 345/593–594, 597, 600–602, 605, 606, 612, 345/519, 520, 522, 530–531, 548–549, 561, 345/204, 690, 618–619, 629–630, 551, 345/553; 358/518, 519, 523–525, 448; 382/162, 167, 254, 274, 276, 298–300, 382/305, 307; 711/100, 104, 105, 123, 125, 711/205–207, 221
See application file for complete search history.

(56) References Cited

U.S. PATENT DOCUMENTS 4,570,217 A 2/1986 Allen et al.
5,091,720 A 2/1992 Wood (Continued)

FOREIGN PATENT DOCUMENTS

CN 101128705 A 2/2008
JP 60-128498 A 7/1985

(Continued)

OTHER PUBLICATIONS

International Search Report (PCT/ISA/210) issued on Aug. 24, 2010, by Japanese Patent Office as the International Searching Authority for International Application No. PCT/JP2010/059394.

(Continued)

*Primary Examiner* — Wesner Sajous
(74) *Attorney, Agent, or Firm* — Buchanan Ingersoll Rooney PC

(57) ABSTRACT

The display color of, for example, a button image responsive to a command input into a facility operation display device is controlled by a palette value having a smaller number of bits than an RGB value. When the display color of the button image is changed, the palette value of a drawing object associated with the button image is changed to an RGB value. This eliminates the necessity of incorporating, for example, a high-performance CPU as a central arithmetic unit. In addition, it is not necessary to pre-store images corresponding to several kinds of display colors specified by RGB values, to thereby eliminates the necessity of incorporating, for example, a high-capacity storage medium in the facility operation display device. Accordingly, the device cost can be reduced.

26 Claims, 16 Drawing Sheets

(56) References Cited

U.S. PATENT DOCUMENTS

| | | | | | |
|---|---|---|---|---|---|
| 5,416,890 | A * | 5/1995 | Beretta | ......................... | 345/590 |
| 5,559,952 | A * | 9/1996 | Fujimoto | ...................... | 345/557 |
| 5,712,651 | A * | 1/1998 | Tomiyasu | ....................... | 345/88 |
| 5,912,710 | A * | 6/1999 | Fujimoto | ...................... | 348/445 |
| 6,191,772 | B1 * | 2/2001 | Mical et al. | ................... | 345/698 |
| 6,199,390 | B1 * | 3/2001 | Mukohara et al. | .............. | 62/127 |
| 6,232,961 | B1 | 5/2001 | Kunimatsu et al. | | |
| 2004/0119696 | A1 | 6/2004 | Amano et al. | | |
| 2005/0196143 | A1 * | 9/2005 | Kato et al. | ...................... | 386/69 |
| 2006/0265126 | A1 | 11/2006 | Olcott | | |
| 2008/0148749 | A1 | 6/2008 | Ishida | | |

FOREIGN PATENT DOCUMENTS

| | | | |
|---|---|---|---|
| JP | 01-310432 | A | 12/1989 |
| JP | 06-022321 | A | 1/1994 |
| JP | 09-185482 | A | 7/1997 |
| JP | 11-015403 | A | 1/1999 |
| JP | 2000-116951 | A | 4/2000 |
| JP | 2000-134503 | A | 5/2000 |
| JP | 2003-058930 | A | 2/2003 |
| JP | 2004-199343 | A | 7/2004 |
| JP | 2008-227547 | A | 8/2005 |
| JP | 3688721 | B2 | 8/2005 |
| JP | 2006-053718 | A | 2/2006 |
| JP | 2007-088912 | A | 4/2007 |
| JP | 2007-145437 | A | 6/2007 |
| JP | 2008-090860 | A | 4/2008 |
| JP | 2009-152836 | A | 7/2009 |
| JP | 2009-296372 | A | 12/2009 |

OTHER PUBLICATIONS

Written Opinion (PCT/ISA/237) issued on Aug. 24, 2010, by Japanese Patent Office as the International Searching Authority for International Application No. PCT/JP2010/059394.

Extended European Search Report dated Apr. 25, 2013, issued by the European Patent Office in corresponding European Patent Application No. 10799685.2-1904 / 2455934. (8 pages).

Dec. 27, 2013 Chinese Office Action issued in Chinese Patent Application No. 201080032037.2.

* cited by examiner

FIG.4

| PALETTE VALUE | R VALUE | G VALUE | B VALUE |
|---|---|---|---|
| 0 | 0 | 0 | 0 |
| 1 | 31 | 0 | 0 |
| 2 | 63 | 0 | 0 |
| ⋮ | ⋮ | ⋮ | ⋮ |
| 255 | 255 | 255 | 255 |

FIG.5

| ADDRESS | CONTENT |
|---|---|
| 0x000000 | PALETTE VALUE AT (0, 0) |
| 0x000001 | PALETTE VALUE AT (1, 0) |
| 0x000002 | PALETTE VALUE AT (2, 0) |
| ⋮ | ⋮ |
| 0x012BFF | PALETTE VALUE AT (319, 239) |

FIG.6

OPERATION SCREEN OBJECT

| PROPERTY ITEM | PROPERTY VALUE |
|---|---|
| INSTANCE ID | 1 |
| CLASS ID | 1 |
| ACTIVE FLAG | 0 |
| PALETTE ID | 0 |
| UPPER INSTANCE ID | NULL |
| LOWER INSTANCE ID | 11,12,13,・・・ |
| POSITION | "(0,0)" |
| SIZE | "(320,240)" |

BACKGROUND OBJECT

| PROPERTY ITEM | PROPERTY VALUE |
|---|---|
| INSTANCE ID | 11 |
| CLASS ID | 2 |
| ACTIVE FLAG | 0 |
| PALETTE ID | 0 |
| UPPER INSTANCE ID | 1 |
| LOWER INSTANCE ID | NULL |
| POSITION | "(0,0)" |
| SIZE | "(320,240)" |

SET TEMPERATURE TEXT AREA OBJECT

| PROPERTY ITEM | PROPERTY VALUE |
|---|---|
| INSTANCE ID | 12 |
| CLASS ID | 3 |
| ACTIVE FLAG | 0 |
| PALETTE ID | 0 |
| UPPER INSTANCE ID | 1 |
| LOWER INSTANCE ID | NULL |
| POSITION | "(50,150)" |
| SIZE | "(80,30)" |
| PALETTE VALUE | 2 |
| TEXT CONTENT | "27°C" |

RAISE SET TEMPERATURE BUTTON OBJECT

| PROPERTY ITEM | PROPERTY VALUE |
|---|---|
| INSTANCE ID | 13 |
| CLASS ID | 4 |
| ACTIVE FLAG | 1 |
| PALETTE ID | 0 |
| UPPER INSTANCE ID | 1 |
| LOWER INSTANCE ID | NULL |
| SIZE | "(180,150)" |
| ICON IMAGE ID | 1 |

⋮

FIG.7

| ITEM | VALUE |
|---|---|
| MODEL NO. | ***** |
| POWER | ON |
| ROOM TEMPERATURE | 27℃ |
| SET TEMPERATURE | 28℃ |
| MODE | COOL |
| FAN SPEED | LOW |
| FAN DIRECTION | 2 |

FIG.8

| INPUT PALETTE VALUE | CONVERTED PALETTE VALUE |
|---|---|
| 0 | 0 |
| 1 | 0 |
| 2 | 1 |
| ⋮ | ⋮ |
| 255 | 146 |

FIG.13

OPERATION SCREEN OBJECT

| PROPERTY ITEM | PROPERTY VALUE |
|---|---|
| INSTANCE ID | 1 |
| CLASS ID | 1 |
| ACTIVE FLAG | 0 |
| PALETTE ID | 0 |
| UPPER INSTANCE ID | NULL |
| LOWER INSTANCE ID | 11,12,13,··· |
| POSITION | "(0,0)" |
| SIZE | "(320,240)" |

BACKGROUND OBJECT

| PROPERTY ITEM | PROPERTY VALUE |
|---|---|
| INSTANCE ID | 11 |
| CLASS ID | 2 |
| ACTIVE FLAG | 0 |
| PALETTE ID | 0 |
| UPPER INSTANCE ID | 1 |
| LOWER INSTANCE ID | NULL |
| POSITION | "(0,0)" |
| SIZE | "(320,240)" |

SET TEMPERATURE TEXT AREA OBJECT

| PROPERTY ITEM | PROPERTY VALUE |
|---|---|
| INSTANCE ID | 12 |
| CLASS ID | 3 |
| ACTIVE FLAG | 0 |
| PALETTE ID | 0 |
| UPPER INSTANCE ID | 1 |
| LOWER INSTANCE ID | NULL |
| POSITION | "(50,150)" |
| SIZE | "(80,30)" |
| PALETTE VALUE | 2 |
| TEXT CONTENT | "28℃" |

RAISE SET TEMPERATURE BUTTON OBJECT

| PROPERTY ITEM | PROPERTY VALUE |
|---|---|
| INSTANCE ID | 13 |
| CLASS ID | 4 |
| ACTIVE FLAG | 1 |
| PALETTE ID | 2 |
| UPPER INSTANCE ID | 1 |
| LOWER INSTANCE ID | NULL |
| SIZE | "(180,150)" |
| ICON IMAGE ID | 1 |

⋮

FIG.14

| PALETTE ID | INPUT PALETTE VALUE | CONVERTED PALETTE VALUE |
|---|---|---|
| 1 | 30 | 3 |
| 2 | 60 | 221 |
| 1 | 82 | 201 |
| 1 | 129 | 35 |

FACILITY OPERATION DISPLAY DEVICE, AIR-CONDITIONING SYSTEM, AND NON-TRANSITORY COMPUTER-READABLE MEDIUM

RELATED APPLICATIONS

This application is based on Japanese Patent Application No. 2009-169592 filed on Jul. 17, 2009 and incorporating the specification, claims and drawings herein by reference in its entirety.

TECHNICAL FIELD

Embodiments of the present invention relate to a facility operation display device, an air-conditioning system, and non-transitory computer-readable medium, and more particularly, to a facility operation display device for controlling facility equipment as an operation target, an air-conditioning system equipped with the facility operation display device, and non-transitory computer-readable medium used by the facility operation display device.

BACKGROUND ART

Facility equipment such as air-conditioning devices and lighting devices installed in a factory or building operates in conjunction with a facility operation display device provided separately from the facility equipment. This type of facility operation display device is provided with functions for displaying information such as the operational state of the facility equipment, functions for receiving commands externally given by a user, etc., and functions for communicating with the facility equipment, etc., and remotely controls the facility equipment (see Patent Literature 1, for example).

A facility operation display device described in Patent Literature 1 is a controller for managing an air-conditioning device, and comprises a main board upon which are disposed a CPU (Central Processing Unit) and ROM (Read Only Memory), an input/output port that receives data such as the operational conditions of the air-conditioning device, a liquid crystal display that displays the operational state, etc. of the air-conditioning device, a touch panel provided overlaying the liquid crystal display, and the like.

Additionally, besides the room temperature, and the like being displayed on the liquid crystal display, a power toggle switch, set temperature modification switch, etc. are displayed. A user is able to grasp the operational state of the air-conditioning device from the displayed information, and is also able to power on the air-conditioning device, modify the set temperature, and the like by touching the displayed switches.

CITATION LIST

Patent Literature & Prior Art Literature

Patent Literature 1: Japanese Patent Publication No. 3688721

PROBLEM TO BE SOLVED

The facility operation display device discussed above has many limitations from a functional perspective. Due to problems of installation space and manufacturing cost, the screen size of the display is smaller compared to a personal computer, etc., peripheral functions such as audio are omitted, and so on. Thus, technologies for improving the operability of a facility operation display device have been variously proposed.

Specifically, there has been proposed technology that modifies the display color of an icon image being operated in order to express that an icon image on a display is being operated. Also, there has been proposed technology that modifies the background screen to a darker than usual display color when a popup window is displayed in order to express that the screen behind the popup screen is in a state that will not accept user operations.

However, in the respective technologies discussed above, it is necessary to store image data for respective icon images with different display colors in memory in advance in order to modify the display color of an icon image being pressed. Also, it is necessary to separately store in memory a drawing object related to an image with the usual display color for which a popup screen is not displayed, and a drawing object related to an image displayed contemporaneously with a popup screen. For this reason, it has been necessary to equip a facility operation display device with memory having a certain degree of capacity.

Also, a method is conceivable wherein only a single drawing object is stored in memory, and the display color is modified by modifying the property information of the drawing object. However, with this method, it is necessary to update information related to all graphics to be displayed and the property information of all images in the case of modifying an image to be displayed by the display. For this reason, there is a disadvantage in that the load on the central processing unit increases while modifying an image.

The present invention, being devised in light of the foregoing circumstances, takes as an object to provide, at low cost, a facility operation display device having functions for displaying the facility state, and so on.

MEANS FOR SOLVING THE PROBLEM

In order to achieve the above object, a facility operation display device in accordance with a first aspect of the present invention is a facility operation display device having a display unit that displays information related to facilities to be operated, comprising an interface that receives commands for the facilities, converter for converting a first palette value corresponding to the color information of respective pixels in an image displayed by the display unit into a second palette value corresponding to the color information of respective pixels in an image displayed by the display unit in response to commands input into the interface, and display controller for determining the color information on the basis of the second palette value, and controlling the display unit so as to display the image composed of pixels with the determined color information.

An air-conditioning system in accordance with a second aspect of the present invention is comprising a facility operation display device provided with a display unit that displays information related to facilities to be operated, an interface that receives commands for the facilities, converter for converting a first palette value corresponding to the color information of respective pixels in an image displayed by the display unit into a second palette value corresponding to the color information of respective pixels in an image displayed by the display unit in response to commands input into the interface, and display controller for determining the color information on the basis of the second palette value, and controlling the display unit so as to display the image composed of pixels with the determined color information, and an air-conditioning device that operates on the basis of the commands input into the facility operation display device.

A non-transitory computer-readable medium in accordance with a third aspect of the present invention stores a program which causes a controller in a facility operation display device having a display unit that displays information related to given facilities to execute a step that converts the display color of respective pixels in the display unit when the information is displayed in response to input commands, and a step that writes the converted display color to storing unit for storing information related to an image displayed by the display unit.

ADVANTAGEOUS EFFECTS OF INVENTION

Advantageous Effect

According to a facility operation display device, an air-conditioning system, and non-transitory computer-readable medium in accordance with the present invention, it becomes no longer necessary to store in advance a plurality of dimmed, inverted, or other images differing only in their display color for one type of image. Thus, the capacity of a storage medium that stores image-related information can be reduced, and device cost can be lowered.

BRIEF DESCRIPTION OF THE DRAWINGS

FIG. 4 is a diagram illustrating an exemplary lookup table;

FIG. 5 is a diagram illustrating an exemplary VRAM memory map;

FIG. 6 is a diagram illustrating exemplary property information related to a drawing object;

FIG. 7 is a diagram illustrating exemplary equipment information in an equipment information storage unit;

FIG. 8 is a diagram illustrating an exemplary palette table;

FIG. 13 is a diagram illustrating exemplary modified property information related to a drawing object;

FIG. 14 is a diagram for explaining an exemplary palette buffer in a palette value converter;

DETAILED DESCRIPTION

First Embodiment

Figure 1:
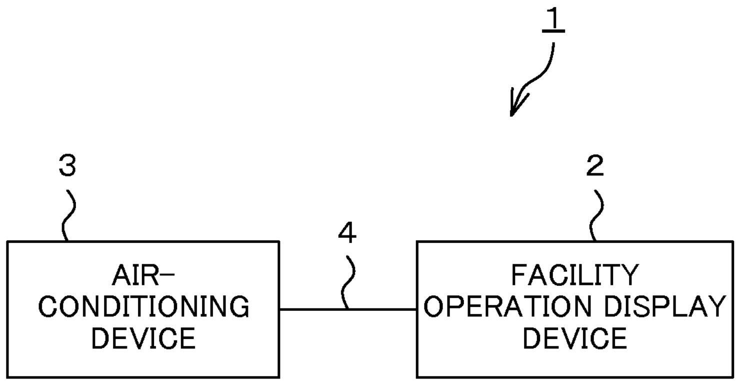
FIG. 1 is a block diagram representing a schematic configuration of an air-conditioning system in accordance with a first embodiment of the present invention.

Hereinafter, a first embodiment of the present invention will be explained with reference to FIGS. 1 to 13. FIG. 1 is a block diagram illustrating a schematic configuration of an air-conditioning system 1 in accordance with a first embodiment of the present invention. The air-conditioning system 1 is a system that maintains temperature, etc. in a room at a given temperature. As illustrated in FIG. 1, the air-conditioning system 1 is configured to include an air-conditioning device 3, and a facility operation display device 2 coupled to the air-conditioning device 3 via a communication pathway 4 consisting of multifilamentary wire or metallic wire, for example.

The air-conditioning device 3 includes a compressor, heater, and electric fan, etc., for example. Additionally, the air-conditioning device 3 ejects air that has been heated or cooled to a given temperature on the basis of commands issued from the facility operation display device 2.

Figure 2:
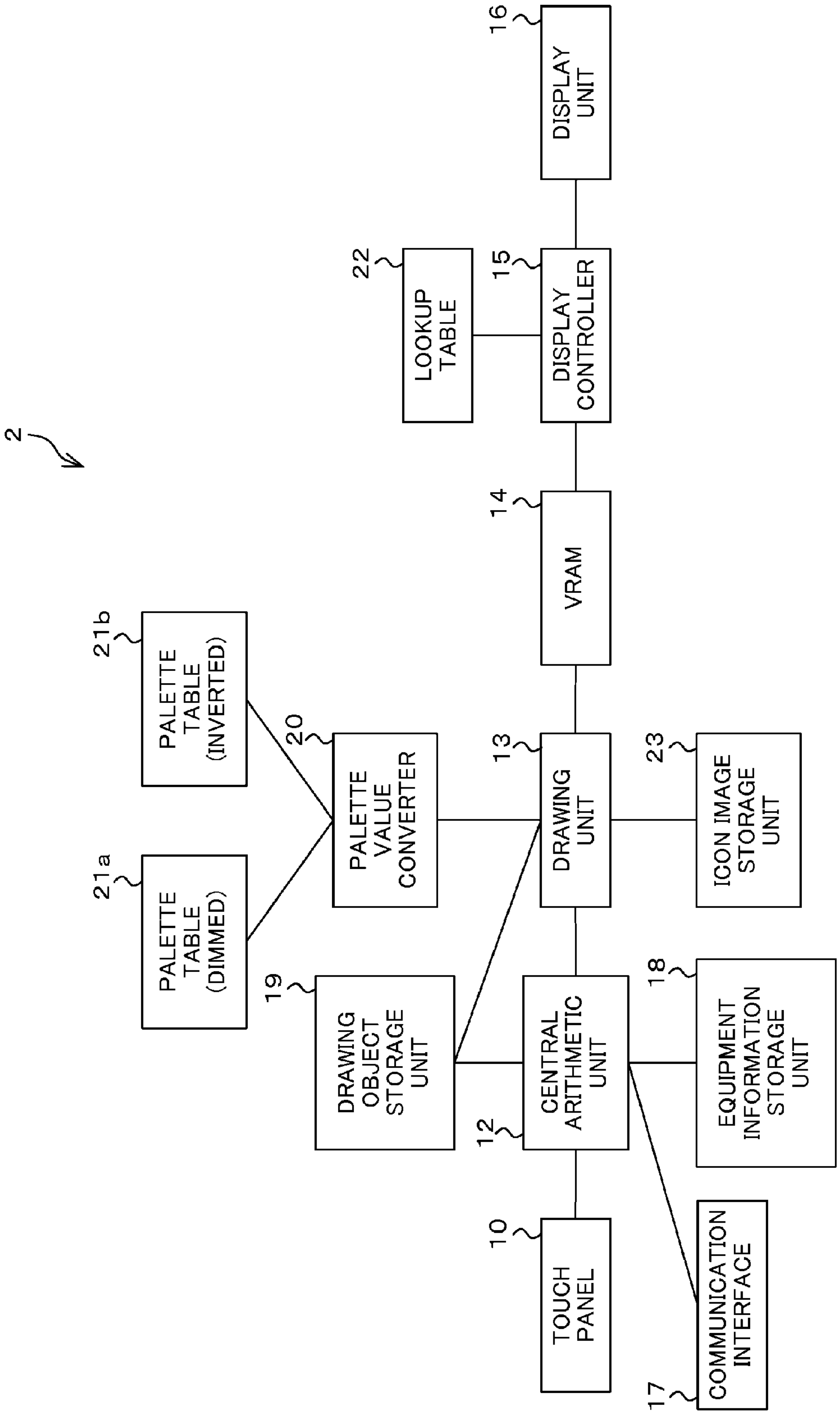
FIG. 2 is a block diagram representing an exemplary facility operation display device.

The facility operation display device 2 receives commands from a user, etc., and issues the commands to the air-conditioning device 3, for example. It also receives information such as the operating conditions of respective units constituting the air-conditioning device 3 and displays images based on the received information. FIG. 2 is a block diagram representing an exemplary facility operation display device 2. As illustrated in FIG. 2, the facility operation display device 2 includes a touch panel 10, a central arithmetic unit 12, a drawing unit 13, VRAM (Video Random Access Memory) 14, a display controller 15, a display unit 16, a communication interface 17, an equipment information storage unit 18, a drawing object storage unit 19, a palette value converter 20, a palette table 21*a*, a palette table 21*b*, a lookup table 22, and an icon image storage unit 23.

The touch panel 10 is disposed in front of the display unit 16. Additionally, the touch panel 10 detects a position touched by the user, and outputs input information to the central arithmetic unit 12 as a detection result.

Figure 3:
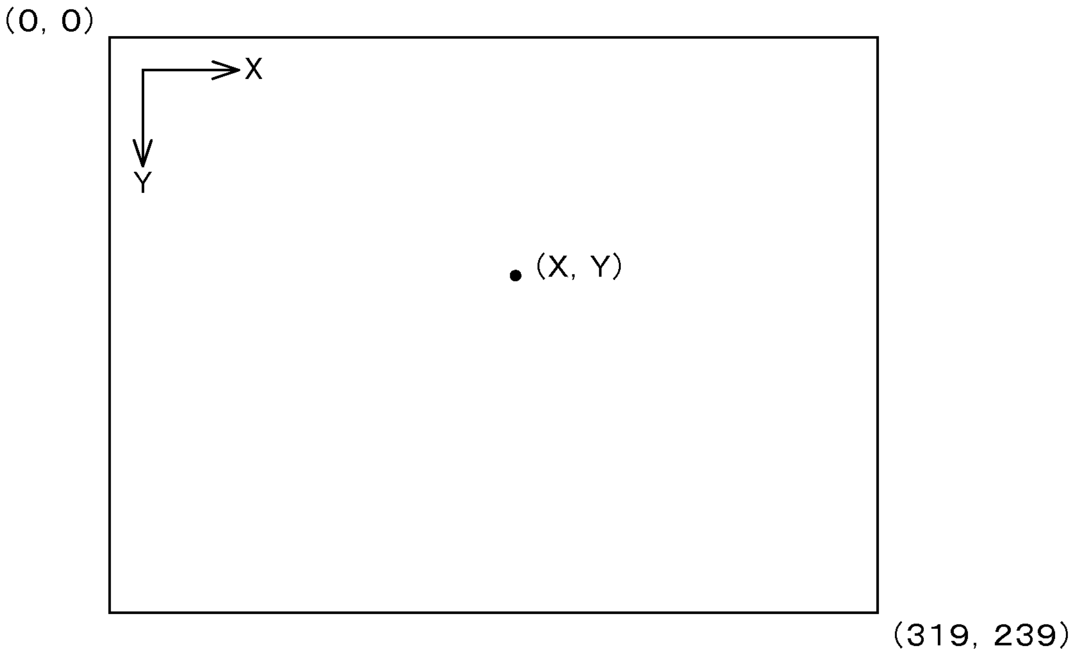
FIG. 3 is a diagram for explaining an exemplary XY coordinate system defined by a display unit.

The display unit 16 includes a liquid crystal display with a resolution of QVGA (Quarter Video Graphics Array) (320×240) size, for example. This display unit 16 is composed of pixels disposed in a matrix of 240 rows by 320 columns. In the present embodiment, as illustrated in FIG. 3, an XY coordinate system taking the upper-left corner of the drawing as its origin is defined on the liquid crystal display, and positions corresponding to respective pixels are displayed as (X, Y). As discussed above, in the liquid crystal display of the display unit 16, pixels are disposed in a matrix of 240 rows by 320 columns. For this reason, the coordinates of the upper-left corner of the liquid crystal display are (0, 0), and the coordinates of the lower-right corner are (319, 239).

Also, the display color of each pixel in the display unit 16 is expressed by an RGB value. This RGB value is a 24-bit numerical value in which the luminance of an R value, a G value, and a B value are expressed by 8 bits (0 to 255) each.

The lookup table 22 is a table for converting a given palette value to an RGB value, and is stored in a register. Herein, a palette value is a value corresponding to a display color handled by the central arithmetic unit 12 and the drawing unit 13, and is expressed as an 8-bit (0 to 255) numerical value. This palette value has a smaller number of bits compared to an RGB value given by a 24-bit numerical value. For this reason, the storage capacity for storing palette tables 21*a* and 21*b* described later which correspond to palette values is smaller than the storage capacity for storing a palette table corresponding to RGB values, for example. Consequently, a comparatively low-capacity storage unit is sufficient as memory for storing the palette tables 21*a* and 21*b*. Also, the amount of memory used for the VRAM 14 explained hereinafter can be reduced for the case where the display controller 15 explained hereinafter uses the lookup table 22 to convert a palette value stored in the VRAM 14 to an RGB value, compared to the case where data expressing a display color as an RGB value is stored in the VRAM 14.

An exemplary lookup table 22 is illustrated in FIG. 4. As reference to FIG. 4 demonstrates, respective R values, G values, and B values are assigned to each palette value from 0 to 255. This lookup table 22 indicates that the RGB value of the display color with a palette value of 1 is (31, 0, 0), and that the RGB value of the display color with a palette value of 2 is (63, 0, 0), for example.

The VRAM 14 is RAM (Random Access Memory) that stores palette values for one screen's worth of the display unit 16. FIG. 5 is a diagram illustrating an exemplary memory map in the VRAM 14. As reference to FIG. 5 demonstrates, a palette value expressing the display color of the pixel at the position (0, 0) among the pixels constituting the liquid crystal display of the display unit 16 is stored at the address 0 in the VRAM 14 (0x000000). Similarly, palette values expressing the display colors of respective pixels at the position (1, 0), the position (2, 0), . . . , the position (319, 239) are stored from the address 1 (0x000001) to the address 6799 (0x012BFF). In the present embodiment, since the resolution of the liquid crystal display of the display unit 16 is QVGA, the VRAM 14 has a capacity equal to or greater than 614400 bits (=320×240×8 (=76800 bytes)).

The display controller 15 reads out a palette value for a single pixel from the VRAM 14, and acquires an RGB value corresponding to this palette value from the lookup table 22. Then, the display controller 15 outputs the acquired RGB value to the display unit 16. The display controller 15 conducts the above operation at a given period (a 70 Hz period, for example) from the pixel at the position (0, 0) in the liquid crystal display of the display unit 16 to the pixel at the position (319, 239) taking the row direction as a basis. In so doing, one screen's worth of RGB values for the display unit 16 is output from the display controller 15. This display controller 15 operates independently from and parallel to the central arithmetic unit 12 and the drawing unit 13.

The central arithmetic unit 12 controls display of the display unit 16 and operation of the air-conditioning device 3. Specifically, the central arithmetic unit 12 manages display content displayed by the display unit 16 as drawing objects having property information including coordinate values defined by the display of the display unit 16 and palette values, etc. Herein, the property information of a drawing object refers to information defining display content managed as a drawing object, and includes property items and property values later discussed. For this reason, the central arithmetic unit 12 issues drawing object drawing instructions to the drawing unit 13 after modifying the property information, including drawing object coordinate values and palette values, etc. In so doing, changes are made to the position on the liquid crystal display where a drawing object is displayed and to its display color, etc. Also, the central arithmetic unit 12 communicates control signals that control operation of the air-conditioning device 3 to the air-conditioning device 3 via the communication interface 17 as necessary.

The drawing object storage unit 19 is RAM that stores information related to drawing objects. For a specific example, as reference to FIG. 6 demonstrates, the drawing object storage unit 19 stores information related to a plurality of drawing objects displayed on the liquid crystal display of the display unit 16. Herein, the plurality of drawing objects displayed by the display unit 16 include for example an operation screen object, a background object, a set temperature text area object, a raise set temperature button object, etc. Information related to a plurality of drawing objects displayed by the display unit 16 includes property information for each drawing object, such as an instance ID and a class ID, for example.

The equipment information storage unit 18 is configured to include RAM, and stores equipment information such as the model name of the air-conditioning device 3, the power status, the room temperature detected by the air-conditioning device 3, and the set temperature, as reference to FIG. 7 demonstrates, for example.

The communication interface 17 is coupled to the communication pathway 4, and communicates with the air-conditioning device 3.

The icon image storage unit 23 is configured to include ROM, and stores an icon image displayed by the display unit 16. The display colors of the pixels that respectively constitute this icon image are expressed by palette values assigned to each pixel constituting the icon image.

The drawing unit 13 executes a drawing process for drawing objects specified by the central arithmetic unit 12. Specifically, the drawing unit 13, upon receiving a drawing command by the central arithmetic unit 12, reads out the property information of the drawing object specified by the central arithmetic unit 12 from the drawing object storage unit 19. Then, on the basis of the positional coordinates on the liquid crystal display of the display unit 16, the size of the icon image, and the icon image ID that identifies the icon image, etc. included in the property information, palette values are written to addresses in the VRAM 14 corresponding to the pixels constituting the icon image to be displayed.

FIG. 8 is a diagram illustrating an exemplary palette table 21*a*. The palette table 21*a* is a table of 256 rows having information associating a palette value expressing a display color for a pixel constituting a normal image displayed by the display unit 16 (in other words, an image subjected to neither dimming nor inversion. Hereinafter, also called a normal image.), and a palette value expressing a display color for the pixel constituting an image obtained by dimming the normal image (hereinafter, also called a dimmed image). Also, the palette table 21*a* saves pre-dimming palette values in a column named Input Palette Value, and saves post-dimming palette values in a column named Output Palette Value. This is because the palette value converter 20 discussed later takes a pre-dimming palette value as an input value, and takes a post-dimming palette value as an output value. Herein, in the present embodiment, 1 is assigned as the palette ID of the palette table 21*a*.

The palette table 21*b* is a table of 256 rows having a structure similar to the palette table 21*a* described above. This palette table 21*b* is a table having information associating a palette value expressing a display color for a pixel constituting a normal image displayed by the display unit 16 with a palette value expressing a display color for the pixel constituting an image obtained by inverting the normal image (hereinafter, also called an inverted image). Herein, in the present embodiment, 2 is assigned as the palette ID of the palette table 21*b*.

The palette value converter 20, when issued with a combination of a palette ID and a palette value (palette ID, palette value) from the drawing unit 13, selects either the palette table 21*a* or the palette table 21*b* according to the value of the palette ID. Then, the palette value converter 20 searches the selected palette table 21*a* or palette table 21*b* for the dimmed or inverted palette value associated with the issued palette value. After that, the palette value found by search is output to the drawing unit 13.

Figure 9:
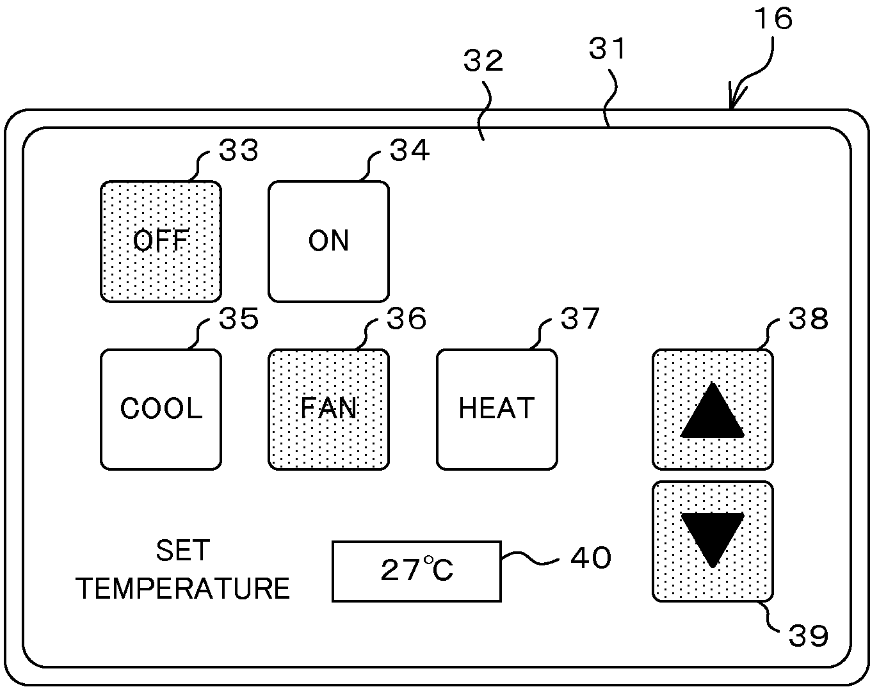
FIG. 9 is a diagram illustrating an exemplary operation screen displayed by a display unit.

In a facility operation display device 2 configured as described above, the operation screen 31 illustrated in FIG. 9, for example, is displayed on the liquid crystal display of the display unit 16. This operation screen 31 is composed of graphics such as lines, circles, and squares, images representing operation buttons, and text expressing text or numerical values such as the set temperature, etc.

The central arithmetic unit 12 handles the individual graphics, images, and text constituting the operation screen 31 as drawing objects, while also managing the drawing objects. In so doing, the central arithmetic unit 12 manages the display content displayed on the operation screen 31. As reference to FIG. 6 demonstrates, the display content managed as drawing objects is defined by property items and the property values corresponding to those property items. For example, the operation screen 31 in FIG. 9 is composed of nine images: a background image, seven button images 33 to 39, and a set temperature text image 40. Thus, the central arithmetic unit 12 treats this operation screen 31 as a collection of 10 drawing objects, such as the operation screen object, background object, set temperature text area object, and raise set temperature button object, etc. illustrated in FIG. 6.

Also, a collection of these drawing objects may have a hierarchical structure. This hierarchical structure is equivalent to layers of an image displayed by the display unit 16, and defines the foreground/background relationship of the background image and the button images 33 to 39, etc. Consequently, by setting a hierarchical level for each drawing object, another image can be displayed in front of a given image.

Figure 10:
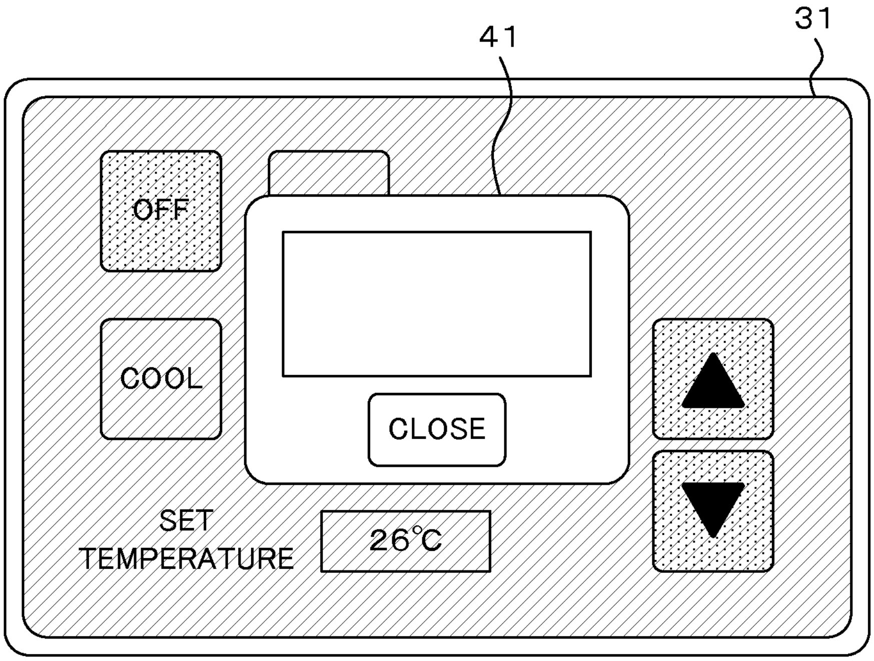
FIG. 10 is a diagram illustrating an exemplary popup image on an operation screen displayed by a display unit.
Figure 11:
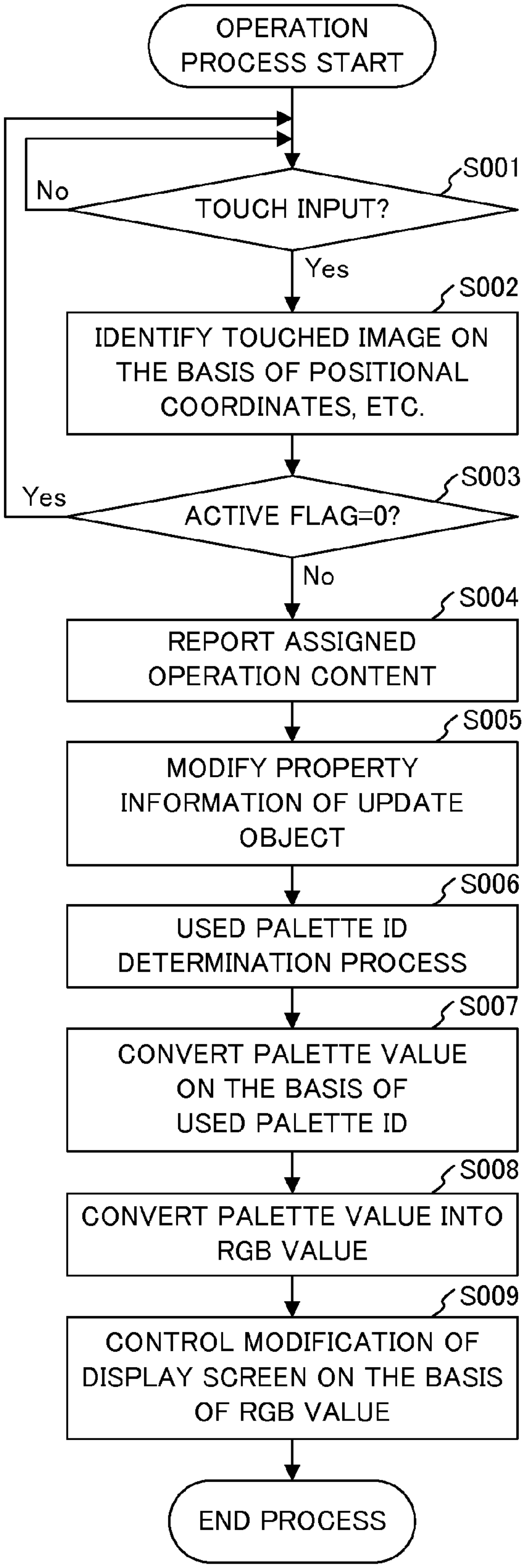
FIG. 11 is a flowchart for explaining exemplary operation of a facility operation display device in accordance with a first embodiment of the present invention.

As illustrated in FIG. 10, such a hierarchical level corresponding to a layer can be assigned to, for example, a popup image 41 representing a popup screen displayed overlaying the operation screen 31. For example, by setting the popup image 41 with a lower hierarchical level than the background image of the operation screen 31 and the button images 33 to 39, the popup image 41 is displayed at the front of the liquid crystal display of the display unit 16, as illustrated in FIG. 10.

Other screens besides the operation screen 31 illustrated in FIG. 9 can be similarly configured as a collection of a plurality of drawing objects. The central arithmetic unit 12 similarly treats other screens as a collection of a plurality of drawing objects having a hierarchical structure.

Also, the property items included in the property information of a drawing object includes an instance ID, a class ID, an active flag, a palette ID, an upper instance ID, a lower instance ID, the position, the size, the palette value, and text content, etc., as reference to FIG. 6 demonstrates. Hereinafter, each property item will be briefly explained.

The instance ID is a unique identifier for identifying a drawing object.

The class ID is an identifier for identifying a class which represents functions shared by a plurality of drawing objects (hereinafter called bundling a plurality of drawing objects). Types of classes include a screen class which bundles a plurality of drawing objects, a rectangle class which represent a rectangle, a text class which represents a text area, and an image class which represents an icon image, etc. In the present embodiment, the case of a class ID of 1 means that the class of a drawing object is the screen class which bundles a plurality of drawing objects, for example. Also, the case of a class ID of 2 means that the class of a drawing object is the rectangle class which represents a rectangle. Also, the case of a class ID of 3 means that the class of a drawing object is the text class which represents a text area. Also, the case of a class ID of 4 means that the class of a drawing object is the image class which represents an icon image.

When an image is touched by a user, the active flag indicates whether or not the central arithmetic unit 12 executes a process assigned in advance to the touched image (hereinafter called the assigned process). For example, in the case where the active flag of a drawing object for the button images 33 to 39 is 1, if the button images 33 to 39 are touched by a user, the central arithmetic unit 12 executes the assigned process that is assigned to the touched images. Also, in the case where the active flag of a drawing object for the button images 33 to 39 is 0, even if the button images 33 to 39 are touched by a user, the central arithmetic unit 12 does not execute a process even if there is an assigned process for the touched images.

The palette ID expresses a table used for palette value conversion from among the palette tables 21*a* and 21*b*. For example, in the case of a palette ID of 1, palette values are converted using the palette table 21*a*. Also, in the case of a palette ID of 2, palette values are converted using the palette table 21*b*.

The upper instance ID expresses the instance ID of the drawing object above a drawing object in a hierarchical structure. Herein, the drawing object of the operation screen 31 illustrated in FIG. 9 is the uppermost operation screen object and does not have an upper drawing object, as reference to FIG. 6 demonstrates. For this reason, the upper instance ID for the drawing object of the operation screen 31 is NULL. Also, for the background object and set temperature text area object, etc. on a hierarchical level directly below the operation screen object, the upper instance ID is "1", the instance ID of the operation screen object.

The lower instance ID expresses the instance ID of the drawing object below a drawing object in a hierarchical structure. For example, the operation screen object has a plurality of lower drawing objects, such as the background object and the set temperature text area object, as reference to FIG. 6 demonstrates. For this reason, the lower instance ID of the operation screen object illustrated in FIG. 9 is the string "11, 12, 13, . . . " wherein the values "11", "12", and "13" of the respective instance IDs of the lower drawing objects are separated by commas. Meanwhile, the lower instance ID is NULL for the background object and the set temperature text area object which do not have lower drawing objects.

Property information of the types explained above is information respectively possessed by each drawing object, but each drawing object also possesses property information unique to each drawing object. For example, in the case where a drawing object's own class is the screen class (class ID=1), the drawing object possesses the XY coordinate values of the upper-left corner of an image corresponding to the drawing object and the image size as property information that is unique to drawing objects in the screen class. Also, in the case where a drawing object's own class is the rectangle class (class ID=2), the drawing object possesses the XY coordinate values of the upper-left corner of an image corresponding to the drawing object, the rectangle size, and the palette value defining the fill color as property information that is unique to drawing objects in the rectangle class. Also, in the case where a drawing object's own class is the image class (class ID=4), the drawing object possesses the XY coordinate values of the upper-left corner of an image corresponding to the drawing object and an image ID for identifying image data expressing the image to be displayed from among the image data stored in the icon image storage unit 23 as property information that is unique to drawing objects in the image class.

Next, exemplary operation of the facility operation display device 2 discussed above will be explained with reference to FIG. 11. Herein, an example will be explained for the case where a button image 38 for raising the set temperature illustrated in FIG. 9 is touched via the touch panel 10. As a premise, the operation screen 31 illustrated in FIG. 9 is taken to be displayed by the display unit 16.

If a user touches the button image 38 via the touch panel 10 (hereinafter called touch input), the touch panel 10 outputs the positional coordinates touched by the user to the central arithmetic unit 12 as input information. Herein, these positional coordinates are positional coordinates in an XY coordinate system set in the liquid crystal display of the display unit 16.

The central arithmetic unit 12 determines whether or not there is touch input by the user, on the basis of whether or not the touch panel 10 outputs positional coordinates (step S001). If the central arithmetic unit 12 determines that there is no touch input (step S001; No), the central arithmetic unit 12 stands by until there is input by the user. In contrast, if the central arithmetic unit 12 determines that there is touch input (step S001; Yes), the central arithmetic unit 12 compares information related to the position and size of each drawing object stored in the drawing object storage unit 19 to the positional coordinates output from the touch panel 10, and identifies the image displayed at the position corresponding to the positional coordinates (hereinafter called the touched image) (step S002). At this point, the central arithmetic unit 12 identifies the touched image displayed at the positional coordinates touched by the user as being the button image 38.

Next, the central arithmetic unit 12 reads out the drawing object related to the identified image from the drawing object storage unit 19, and also checks whether or not the value of the active flag for the read out drawing object is "0" (step S003). The active flag determines whether or not to execute an assigned process, as discussed earlier. In the case where the active flag is 1 (step S003; No), the central arithmetic unit 12 executes the process assigned to the drawing object. In contrast, in the case where the active flag is 0 (step S003; Yes), the central arithmetic unit 12 takes the user's input to be invalid and also returns to step S001. After that, the central arithmetic unit 12 stands by until the next input.

As illustrated in FIG. 6, the active flag is 1 for the raise set temperature button object. For this reason, the central arithmetic unit 12 executes a raise set temperature operation assigned to the raise set temperature button object.

With the raise set temperature operation, the central arithmetic unit 12 conducts an operation for modifying the set temperature by just 1° C. from the current 27° C. to 28° C. First, the central arithmetic unit 12 reports to the air-conditioning device 3 via the communication interface 17 that the matter of the raise set temperature operation assigned to the raise set temperature button object is the matter of modifying the set temperature from 27° C. to 28° C. (step S004). Next, the central arithmetic unit 12 modifies the property information possessed by the drawing object of the image to be updated (hereinafter called the update object) (step S005).

Figure 12:
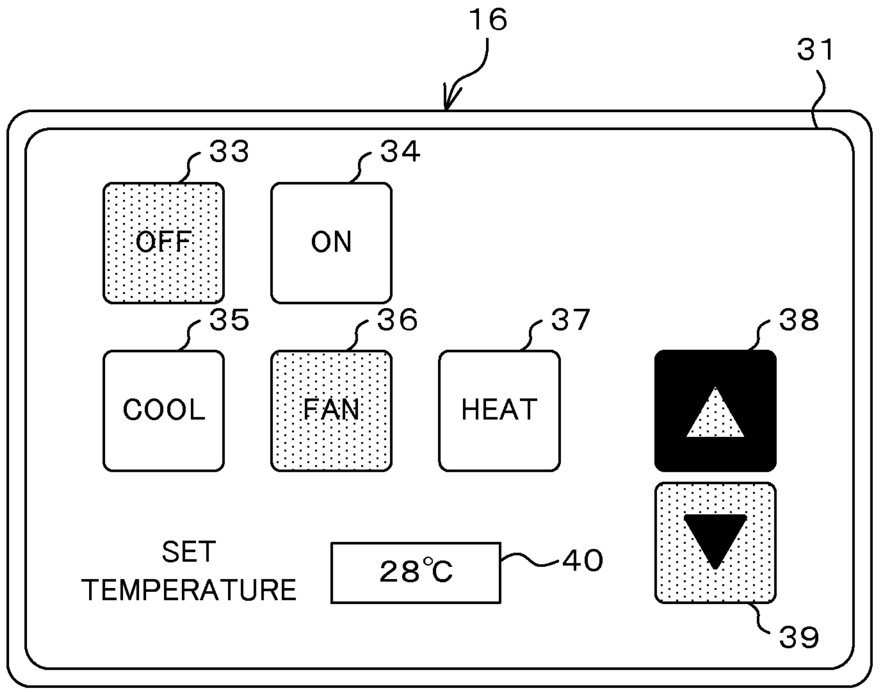
FIG. 12 is a diagram illustrating an exemplary modified operation screen displayed by a display unit.

At this point, the central arithmetic unit 12 modifies the palette ID of the raise set temperature button object illustrated in FIG. 6 from 0 to 2 as illustrated in FIG. 13, in order for the button image 38 for raising the set temperature to be displayed inverted as illustrated in FIG. 12 as an example. Next, the text content of the set temperature text area object illustrated in FIG. 6 is modified from 27° C. to 28° C., as illustrated in FIG. 13.

Next, the central arithmetic unit 12 outputs instance IDs identifying the drawing objects of images to be modified to the drawing unit 13. At this point, the instance ID (=13) of the raise set temperature button object and the instance ID (=12) of the set temperature text area object are output to the drawing unit 13.

In order to draw images related to drawing objects, the drawing unit 13 identifies drawing objects corresponding to the instance IDs acquired from the central arithmetic unit 12. Next, the drawing unit 13 acquires the palette IDs of the identified drawing objects from the drawing object storage unit 19. Then, in the case where an acquired palette ID is 1 or 2 and not 0, the drawing unit 13 determines that the acquired palette ID is a palette ID used in palette value conversion (hereinafter called a used palette ID).

Also, in the case where an acquired palette ID is 0, the drawing unit 13 acquires the palette ID of the one higher (displayed one behind) drawing object. Thereafter, the drawing unit 13 repeats the above process (hereinafter called the used palette ID determination process) until a palette ID with a value of 1 is acquired (step S006). However, in the case where the palette ID of the uppermost (rearmost) drawing object is 0, the drawing unit 13 takes the used palette ID to be 0.

For example, as reference to FIG. 13 demonstrates, since the palette ID is 2 for the raise set temperature button object, the drawing unit 13 takes this palette ID as the palette ID used for palette value conversion (in other words, as the used palette ID). Meanwhile, since the palette ID is 0 for the set temperature text area object, the drawing unit 13 acquires a palette ID from the one higher operation screen object.

When a palette ID used for palette value conversion is determined by such rules, the display color of an entire screen may be modified by modifying just the palette ID of the drawing object for the image constituting that screen. For this reason, it becomes no longer necessary to modify the palette values or palette IDs of all drawing objects below that screen.

Next, the drawing unit 13 acquires the class IDs of the drawing objects from the drawing object storage unit 19. In the processing thereafter, the drawing unit 13 writes a palette value to the VRAM 14 in a procedure determined for each class.

Next, the drawing unit 13 extracts the icon image ID from a drawing object corresponding to an instance ID acquired from the central arithmetic unit 12. Next, the drawing unit 13 reads out image data corresponding to this icon image ID from the icon image storage unit 23. Herein, this image data is data that includes a palette value for the pixels constituting that image.

Next, for a drawing object whose palette ID is 0, the drawing unit 13 writes, without converting, the palette value included in the data acquired from the icon image storage unit 23 to the address in the VRAM 14 corresponding to the position information for the drawing object.

In contrast, in the case where the palette ID is 1 or 2, the drawing unit 13 outputs the combination of this palette ID and the palette value included in the data acquired from the icon image storage unit 23 to the palette value converter 20.

The palette value converter 20, upon acquiring a palette ID and a palette value acquired from the drawing unit 13, converts the palette value on the basis of the palette table 21*a* in the case where the palette ID is 1. Next, the palette value converter 20 outputs the converted palette value to the drawing unit 13. Also, the palette value converter 20 converts the palette value on the basis of the palette table 21*b* in the case where the palette ID is 2 (step S007). Next, the palette value converter 20 outputs the converted palette value to the drawing unit 13.

The drawing unit 13, upon acquiring a palette value that has been converted (hereinafter called a converted palette value) from the palette value converter 20, writes this converted palette value to the address in the VRAM 14 corresponding to the position information for the drawing object. This writing is conducted in a procedure determined for each class defined by a class ID.

As reference to FIG. 12 demonstrates, in the present embodiment, processing to invert the button image 38 is executed. For this reason, the palette ID of the raise set temperature button object becomes 2, as illustrated in FIG. 13. In so doing, a palette value is converted by the palette value converter 20 on the basis of the palette table 21*b*, which is used when displaying an image inverted. Also, a post-conversion converted palette value is output to the drawing unit 13. Then, a converted palette value output to the drawing unit 13 is written to a given address in the VRAM 14. Since the palette ID of the set temperature text area object is 0, a palette value expressing a set temperature text image is written to a given address in the VRAM 14 without being converted. This writing is conducted in a procedure determined for each class defined by a class ID.

When palette values are written to the VRAM 14, the display controller 15 sequentially reads out these palette values. Then, the display controller 15 references the lookup table 22 to convert a palette value into an RGB value, and outputs this RGB value to the display unit 16 (step S008).

According to the above process, the operation screen 31 illustrated in FIG. 9 is modified on the basis of output RGB values to a screen indicating that the button image 38 is being operated and that the set temperature has been modified to 28° C. like the operation screen 31 illustrated in FIG. 12 (step S009).

As explained above, in the first embodiment, the display color of a button image, etc. responsive to input commands is managed with a palette value, which has a smaller number of bits than an RGB value. Thus, since the amount of data handled by the central arithmetic unit 12 decreases, it becomes no longer necessary to incorporate a high-performance CPU, etc. as the central arithmetic unit 12.

Also, in the case of modifying the display color of, for example, a button image 38, etc. responsive to commands input into the facility operation display device 2, palette value conversion is conducted by the palette value converter 20, and the display color is modified on the basis of the converted palette value. Consequently, it becomes no longer necessary for the facility operation display device 2 to store in advance a plurality of dimmed, inverted, or other images differing only in their display color for one type of image. Thus, size reduction of the storage medium incorporated into the facility operation display device 2 becomes possible, and as a result, lowered device cost can be realized.

Also, in the first embodiment, even in the case of modifying the display color (dimmed display or inverted display, etc.) of a plurality of images included in an operation screen 31 all at once, it is sufficient to modify just the palette ID of the upper drawing object containing those images (i.e., the drawing object for the image displayed behind those images). For this reason, the processing load on the central arithmetic unit 12 can be decreased.

Also, when displaying a popup image 41 on an operation screen 31 like that illustrated in FIG. 10, it is possible to realize dimmed display of all portions of the operation screen 31 other than the popup image 41 by modifying the palette ID of the operation screen object to 1.

Modification 1

Herein, in the first embodiment, palette tables 21*a* and 21*b* were used to convert palette values, but an embodiment is not limited thereto, and palette values may also be converted according to computation using a given algorithm. For example, computation that takes the inversion of each bit in an input palette value as the converted palette value is conceivable as computation using a given algorithm. According to the above, the palette tables 21*a* and 21*b* become unnecessary, and memory storage capacity can be reduced.

Modification 2

Also, in the first embodiment, palette tables 21*a* and 21*b* were used to convert palette values. However, the present invention is not limited thereto, and the palette value converter 20 may also be provided with a palette buffer that stores palette IDs, input palette values, and converted palette values in relationship as illustrated in FIG. 14, for example.

This palette buffer is able to store some or all of the palette tables 21*a* and 21*b*. In the case where a relevant palette value is being stored in the palette buffer (i.e., in the case where a record saving a palette value taken as a conversion target and a palette value after conversion (converted palette value) is being stored in the palette buffer), the palette value converter 20 outputs the relevant contents of the palette buffer (i.e., the converted palette value saved in the record) to the drawing unit 13 without referencing the palette tables 21*a* and 21*b*.

Also, the contents of the palette buffer may also be taken to be successively updated. For example, in the case where conversion of an input palette value using the palette table 21*a* or 21*b* according to a given palette ID is requested, and furthermore where the converted palette value corresponding to the input palette value is not being stored in the palette buffer, the palette value converter 20 references the palette table 21*a* or 21*b* according to the palette ID. Then, the palette value converter 20 specifies the converted palette value corresponding to the input palette value and outputs the specified converted palette value. After that, the palette value converter 20 may also be taken to erase one of the combinations of an input palette value and a converted palette value from the palette buffer, and newly store the combination of the converted palette value that was output most recently and the input palette value corresponding to this converted palette value in the palette buffer.

The palette value combination to be erased may be the oldest palette values stored in the palette buffer (First In First Out), or the palette values having the oldest palette conversion request (Last Recent Use).

According to the above, it becomes possible to rapidly convert palette values in a facility operation display device having slow palette table and palette conversion table access speeds, and as a result it becomes possible to rapidly conduct drawing processes.

Second Embodiment

Next, a second embodiment of the present invention will be explained with reference to FIGS. 15 and 16. Herein, explanation will be omitted or simplified for portions of the configuration which are identical or equivalent to those of the first embodiment.

The air-conditioning system 1 in accordance with the present embodiment differs from the air-conditioning system 1 in accordance with the first embodiment in that the facility operation display device 2 is realized by a configuration similar to that of a device such as a typical computer.

Figure 15:
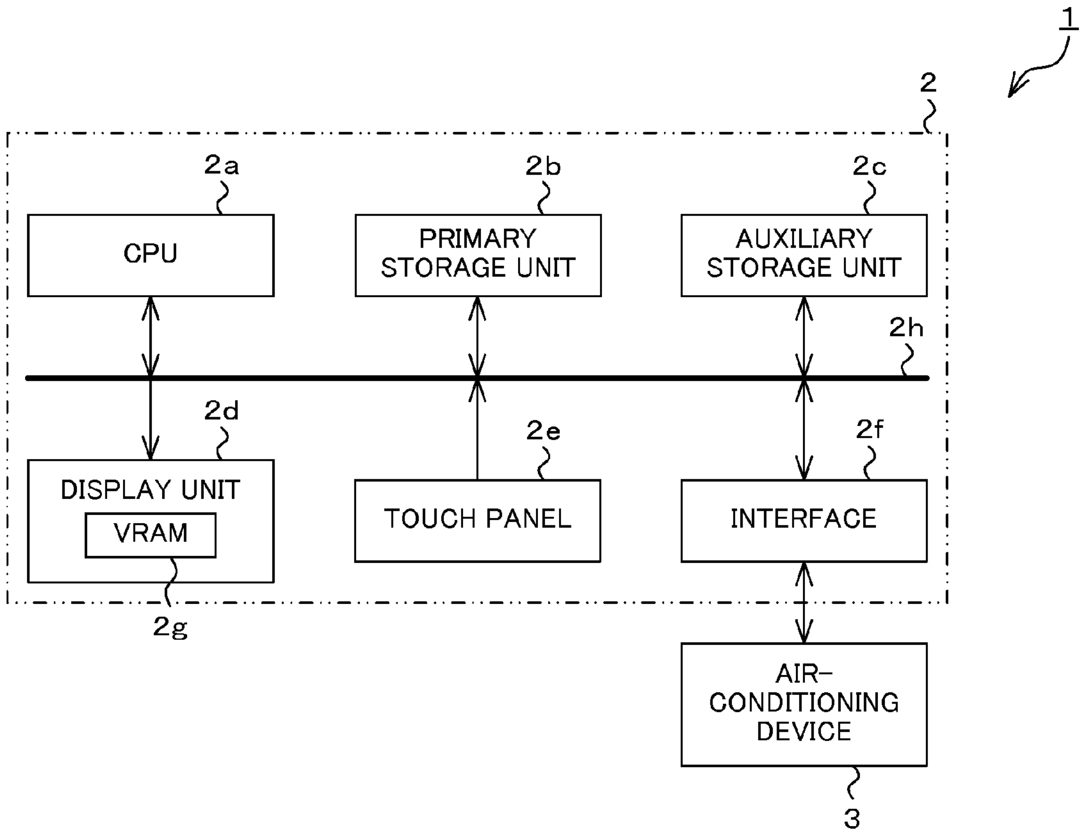
FIG. 15 is a block diagram representing an exemplary physical configuration of a facility operation display device in accordance with a second embodiment of the present invention.

FIG. 15 is a block diagram illustrating an exemplary physical configuration of the facility operation display device 2. As illustrated in FIG. 15, the facility operation display device 2 is configured to include a CPU (Central Processing Unit) 2*a*, a primary storage unit 2*b*, an auxiliary storage unit 2*c*, a display unit 2*d*, a touch panel 2*e*, an interface 2*f*, and a system bus 2*h* that mutually couples the respective units above.

The CPU 2*a* controls the respective units 2*b* to 2*f* above by following a program stored in the auxiliary storage unit 2*c*.

The primary storage unit 2*b* is configured to include RAM (Random Access Memory), etc., and is used as a work area for the CPU 2*a*.

The auxiliary storage unit 2*c* is configured to include non-volatile memory such as ROM (Read Only Memory), a magnetic disk, or semiconductor memory. This auxiliary storage unit 2*c* stores programs executed by the CPU 2*a* and various parameters, etc., while also storing the information stored in the equipment information storage unit 18, the drawing object storage unit 19, the palette tables 21*a* and 21*b*, as well as the icon image storage unit 23 in accordance with the first embodiment.

The display unit 2*d* is configured to include VRAM 2*g*, a liquid crystal display, etc., and displays processing results from the CPU 2*a*. In the present embodiment, the operation screen 31 illustrated in FIGS. 9 and 12, etc. is displayed by the display unit 2*d*.

The touch panel 2*e* is provided overlaying the liquid crystal display of the display unit 2*d*. Operation instructions are input via this touch panel 2*e* and reported to the CPU 2*a* via the system bus 2*h*.

The interface 2*f* couples the air-conditioning device 3 and the system bus 2*h*.

Figure 16:
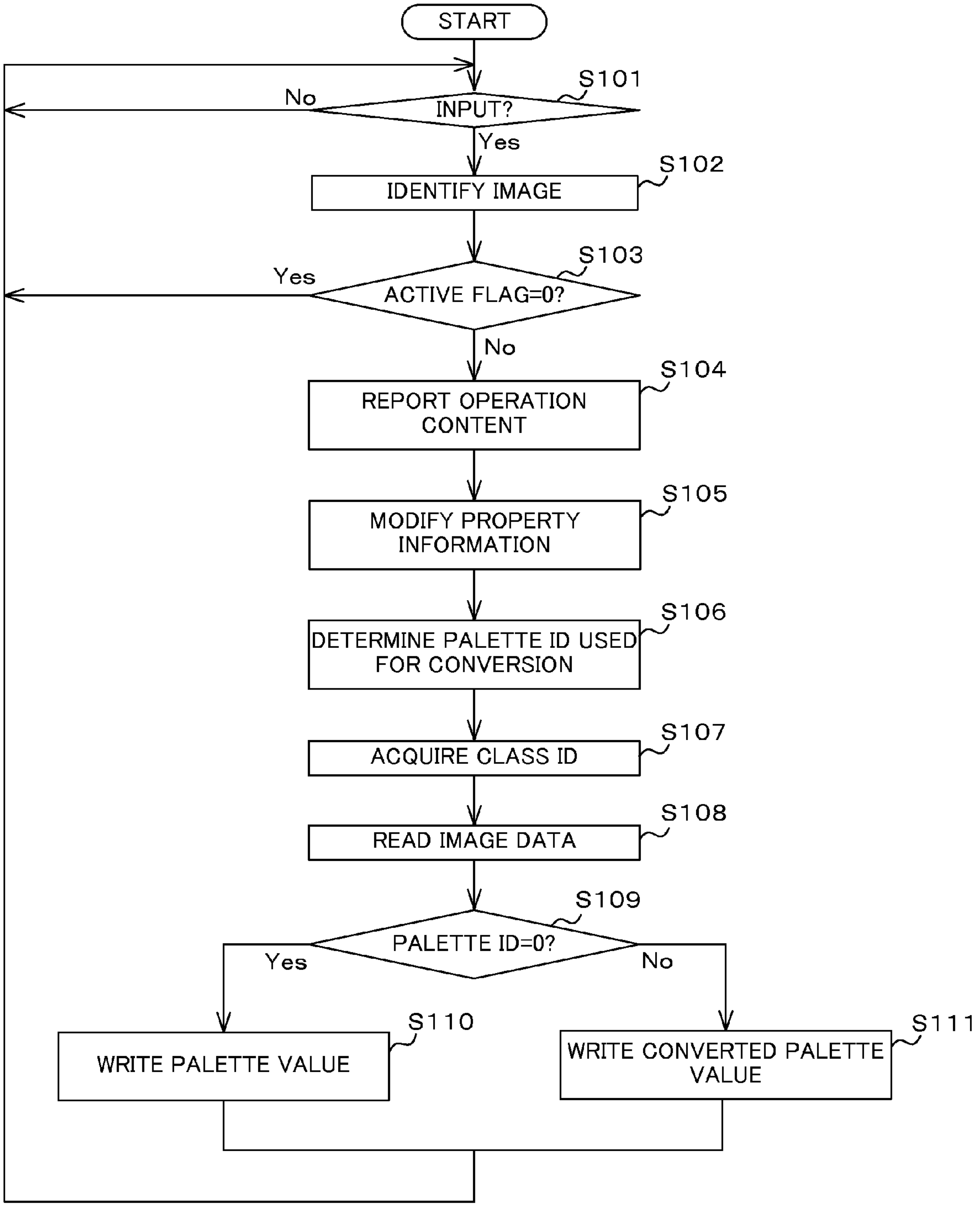
FIG. 16 is a flowchart for explaining operation of a facility operation display device in accordance with a second embodiment of the present invention.

The flowchart in FIG. 16 corresponds to a series of processing algorithms of a program executed by the CPU 2*a* of the facility operation display device 2. Hereinafter, operation of the facility operation display device 2 will be explained with reference to FIG. 16. Herein, in the facility operation display device 2, the CPU 2*a* conducts overall control of the primary storage unit 2*b*, the auxiliary storage unit 2*c*, the display unit 2*d*, and the interface 2*f* by following a program read out from the auxiliary storage unit 2*c*. Also, herein, an example will be explained for the case where the button image 38 for raising the set temperature in FIG. 9 is touched via the touch panel 2*e*.

First, in the first step S101, the CPU 2*a* determines the presence or absence of input from a user. The determination in step S101 is negative until the touch panel 2*e* is touched by a user. In contrast, if a user touches the button image 38 via the touch panel 2*e*, the positional coordinates touched by the user are output from the touch panel 2*e*. In this case, the determination in step S101 is positive. In the case where the determination in step S101 is positive (step S101; Yes), the CPU 2*a* proceeds to the next step S102.

In the next step S102, the CPU 2*a* compares information related to the position and size of each drawing object stored in the auxiliary storage unit 2*c* to the positional coordinates output from the touch panel 2*e*, and identifies the image displayed at the position corresponding to the positional coordinates. At this point, the CPU 2*a* identifies the image displayed at the positional coordinates touched by the user as being the button image 38.

In the next step S103, the CPU 2*a* extracts the drawing object related to the identified image from the auxiliary storage unit 2*c*. Then, the CPU 2*a* checks the value of the active flag for the extracted drawing object. As discussed earlier, the active flag is for determining whether or not to execute specific processing. In the case where the active flag is 0 (step S103; Yes), the CPU 2*a* returns to step S101. In contrast, in the case where the active flag is 1 (step S103; No), the CPU 2*a* proceeds to the next step S104.

As illustrated in FIG. 6, in the raise set temperature button object, the active flag is 1. For this reason, the determination in step S103 is negative (step S103; No), and the CPU 2*a* proceeds to the next step S104.

In the next step S104, the CPU 2*a* reports to the air-conditioning device 3 via the interface 2*f* that the set temperature has been modified from 27° C. to 28° C.

In the next step S105, the CPU 2*a* modifies the palette ID of the raise set temperature button object illustrated in FIG. 6 from 0 to 2 as illustrated in FIG. 13, in order for the button image 38 for raising the set temperature to be displayed inverted as illustrated in FIG. 12 as an example. Next, the text content of the set temperature text area object illustrated in FIG. 6 is modified from 27° C. to 28° C., as illustrated in FIG. 13.

In the next step S106, the CPU 2*a* extracts a palette ID from the drawing object. Then, in the case where the extracted palette ID is 1 or 2, the CPU 2*a* takes this palette ID as a palette ID used for palette value conversion (i.e., a used palette ID). Also, in the case where the extracted palette ID is 0, the CPU 2*a* extracts the palette ID of the one higher drawing object. Thereafter, the CPU 2*a* repeats the processing discussed above until a palette ID with a value of 1 is acquired.

For example, as reference to FIG. 13 demonstrates, since the palette ID is 2 for the raise set temperature button object, the CPU 2*a* takes this palette ID as the palette ID used for palette value conversion. Meanwhile, since the palette ID is 0 for the set temperature text area object, the CPU 2*a* acquires a palette ID from the one higher operation screen object.

In the next step S107, the CPU 2*a* acquires the class ID of the drawing object.

In the next step S108, the CPU 2*a* extracts the icon image ID from the drawing object. Then, the CPU 2*a* reads out image data corresponding to this icon image ID from the auxiliary storage unit 2*c*. Herein, this image data is data that includes a palette value for the pixels constituting that image.

In the next step S109, the CPU 2*a* determines whether or not the used palette ID is 0. In the case where the used palette ID is 0, the determination in step S109 is positive (step S109; Yes), and the CPU 2*a* proceeds to the next step S110. Also, in the case where the used palette ID is anything other than 0, the determination in step S109 is negative (step S109; No), and the CPU 2*a* proceeds to the next step S111.

In step S110, the CPU 2*a* writes, without converting, the palette value included in the data acquired from the auxiliary storage unit 2*c* to the address in the VRAM 2*g* corresponding to the position information for the drawing object. This writing is conducted in a procedure determined for each class defined by a class ID.

In contrast, in step S111, in the case where the palette ID is 1, the CPU 2*a* converts the palette value included in the data acquired from the auxiliary storage unit 2*c* on the basis of a table equivalent to the palette table 21*a*. Also, in the case where the palette ID is 2, the CPU 2*a* converts the palette value on the basis of a table equivalent to the palette table 21*b*. Then, the CPU 2*a* writes the converted palette value to the address in the VRAM 2*g* corresponding to the position information for the drawing object. This writing is conducted in a procedure determined for each class defined by a class ID.

When the processing in step S110 or in step S111 ends, the CPU 2*a* returns to the first step S101, and thereafter repeats execution of the processing from step S101 to step S111.

Meanwhile, the display unit 2*d* successively reads out palette values written to the VRAM 2*g* and converts the read out palette values into sequential RGB values by referencing a table equivalent to the lookup table 22. Then, the display unit 2*d* drives the liquid crystal display on the basis of the RGB values.

According to the above process, the operation screen 31 illustrated in FIG. 9 is modified to an operation screen 31 indicating that the button image 38 is being operated and that the set temperature has been modified to 28° C. like the operation screen 31 illustrated in FIG. 12.

As explained earlier, in the second embodiment, the display color of a button image, etc. responsive to input commands is managed with a palette value, which has a smaller number of bits than an RGB value. Thus, since the amount of data handled by the CPU 2*a* decreases, it becomes no longer necessary to incorporate a high-performance CPU as the CPU 2*a*.

Also, in the case of modifying the display color of, for example, a button image 38, etc. responsive to commands input into the facility operation display device 2, palette value conversion is conducted by the palette value converter 20, and the display color is modified on the basis of the converted palette value. Consequently, it becomes no longer necessary for the facility operation display device 2 to store in advance a plurality of dimmed, inverted, or other images differing only in their display color for one type of image. Thus, size reduction of the storage medium incorporated into the facility operation display device 2 becomes possible, and as a result, lowered device cost can be realized.

Also, in the second embodiment, even in the case of modifying the display color (dimmed display or inverted display) of a plurality of images included in an operation screen 31 all at once, it is sufficient to modify just the palette ID of the upper drawing object containing those images. For this reason, the processing load on the central arithmetic unit 12 can be decreased.

Third Embodiment

Next, a third embodiment of the present invention will be explained. Herein, explanation will be omitted or simplified for portions of the configuration which are identical or equivalent to those of the first embodiment.

A facility operation display device constituting an air-conditioning system in accordance with the present embodiment manages display content to be displayed as drawing objects, similarly to the facility operation display device 2 in accordance with the first embodiment. However, the hierarchical structure of drawing objects differs between drawing objects managed by a facility operation display device 2 in accordance with the first embodiment and drawing objects managed by a facility operation display device in accordance with the present embodiment (hereinafter simply called the facility operation display device).

In the hierarchical structure of drawing objects managed by the facility operation display device, a drawing object belonging to an upper hierarchical level is composed of drawing objects belonging to a lower hierarchical level. In other words, a drawing object belonging to a lower hierarchical level is a component of a drawing object belonging to an upper hierarchical level. More specifically, the drawing object of the operation screen 31 illustrated in FIG. 9 (i.e., the operation screen object) is composed of a background object, a set temperature text area object, and a raise set temperature button object belonging to lower hierarchical levels. This is because the operation screen 31 has a background image, a set temperature text image 40, and button images 33 to 39 representing buttons on-screen.

Herein, in the case where the facility operation display device dims display of the operation screen 31, both the set temperature text image 40 and the button images 33 to 39 on the operation screen 31 are dimmed contemporaneously. This is to indicate that not only the operation screen 31 but also the text boxes and buttons on the operation screen 31 are buttons, etc. which cannot be operated, etc. by the user. Herein, the drawing objects for text images and button images on the operation screen 31 belong to hierarchical levels which are lower than that of the drawing object for the operation screen 31, regardless of what text images and button images are disposed on the operation screen 31. Consequently, in the case where the facility operation display device dims display of the operation screen 31, the operation screen 31 is dimmed on the basis of a modified palette ID after modifying the palette ID possessed by the drawing object for the operation screen 31 belonging to an upper hierarchical level to an ID identifying the palette table 21*a* for dimming. On the other hand, the facility operation display device does not modify the palette IDs possessed by the drawing objects for the set temperature text image 40 and the button images 33 to 39 belonging to hierarchical levels which are lower than that of the drawing object for the operation screen 31. Next, in the case of dimming display of the set temperature text image 40 and the buttons 33 to 39 on the operation screen 31, the facility operation display device dims display of the set temperature text image 40 and the button images 33 to 39 on the basis of the palette ID possessed by an identified drawing object for the operation screen 31 after identifying that the drawing object belonging to a hierarchical level higher than those of the drawing objects for the set temperature text image 40 and the button images 33 to 39 is the drawing object for the operation screen 31. Meanwhile, the facility operation display device conducts a similar process for inverted display.

According to such configurations, in the case of dimming or inverting display of a screen, it is sufficient to update the property information possessed by the object for the screen, and it is not necessary to update the property information of the objects for all parts such as text images and button images, etc. disposed on the screen. For this reason, the processing load when modifying an image representing a screen to a dimmed or inverted display can be reduced.

Herein, a screen is not only the entire display content displayed by the display unit 16, but also includes popup screens displayed as a window like that illustrated in FIG. 10, as well as a given area inside a window, for example. For this reason, the screen objects managed by the facility operation display device include not only the operation screen object, but also objects for popup screens (hereinafter called popup screen objects) as well as objects for a given area inside a popup screen (hereinafter called screen area objects).

Herein, the operation screen 31 in FIG. 10 is not composed of the popup screen 41, nor is the popup image 41 composed of the operation screen 31. In other words, the operation screen 31 and the popup screen 41 are separate, independent screens. For this reason, an operation screen object and a popup screen object do not belong to the same hierarchical structure. Thus, a facility operation display device cannot acquire the properties of a popup screen object on the basis of the hierarchical structure possessed by an operation screen object, nor can it acquire the properties possessed by an operation screen object on the basis of the hierarchical structure possessed by a popup screen object. For this reason, a facility operation display device is able to separately and independently manage dimmed display of the operation screen 31 and dimmed display of the popup image 41. Furthermore, a facility operation display device is able to similarly manage inverted display by conducting a similar process.

The foregoing thus describes embodiments of the present invention, but the present invention is not limited by the foregoing embodiments.

For example, in the foregoing respective embodiments and modifications, an RGB value may be stored in VRAM as the display color of a screen, and the palette value converter 20 may convert a received RGB value (in other words, an RGB value before conversion into an RGB value for dimming or inversion) with a method similar to the palette value conversion method described in the present embodiments.

Also, in the foregoing respective embodiments, the display color of a drawing object is expressed by a palette value, but an embodiment is not limited thereto, and a display color may also be expressed by an RGB value. In this case, an RGB value is converted into a dimmed or inverted RGB value by the palette value converter 20 and stored in the VRAM 14. The RGB value stored in the VRAM 14 is output to the display unit 16 by the display controller 15. According to the above, since the display color of an image is modified due to its RGB value being modified, it similarly becomes no longer necessary to store in advance a plurality of dimmed, inverted, or other images differing only in their display color for one type of image.

Also, in the foregoing respective embodiments and modifications, the communication pathway 4 was taken to be a metallic communication line, but an embodiment is not limited thereto, and it may also be configured such that the air-conditioning device 3 is operated remotely using wired communication. Also, the communication pathway 4 may be taken to be a wireless communication pathway.

Also, in the foregoing respective embodiments, the air-conditioning device 3 and the facility operation display device 2 were separately provided, but an embodiment is not limited thereto, and the facility operation display device 2 may be built into the air-conditioning device 3. For example, the communication pathway 4 may also be taken to be a wire harness.

Also, in the foregoing respective embodiments, it may also be configured such that a program stored in the auxiliary storage unit 2*c* of the facility operation display device 2 is stored and distributed on a computer-readable recording medium such as a flexible disk, CD-ROM (Compact Disk Read-Only Memory), DVD (Digital Versatile Disk), or MO (Magneto-Optical Disk), whereby a device that executes the processes discussed earlier is constituted by installing that program.

Also, it may be configured such that the program is stored in a disk device, etc. possessed by a given server device on a communication network such as the Internet, and superposed onto a carrier wave and downloaded, etc., for example.

Also, in cases such as where the functions discussed above are realized by an OS (Operating System) assuming the burden or realized by cooperation between an OS and an application, it may be configured such that only the portions other than the OS are stored and distributed onto a medium or downloaded, etc.

Also, various embodiments and modifications of the present invention are possible without departing from the scope and spirit of the present invention in the broad sense. Also, the embodiments discussed earlier are for explaining the present invention and do not limit the scope of the present invention. The scope of the present invention is indicated by the claims rather than the embodiments. Additionally, various modifications performed within the scope of the claims or their equivalents are to be deemed within the scope of the present invention.

The present invention is based on Japanese Patent Application No. 2009-169592 filed in the Japan Patent Office on Jul. 17, 2009. The specification, claims, and figures of Japanese Patent Application No. 2009-169592 are hereby incorporated herein by reference.

INDUSTRIAL APPLICABILITY

The embodiments are is applicable to a facility operation display device which is a graphical interface for facility equipment such as air conditioning units or lighting, the facility operation display device being characterized by causing a user to visually perceive the facility state.

DESCRIPTION OF REFERENCE SIGNS LIST

1: air-conditioning system
2: facility operation display device
2*a*: CPU
2*b*: primary storage unit
2*c*: auxiliary storage unit
2*d*: display unit
2*e*: touch panel
2*f*: interface
2*g*: VRAM
2*h*: system bus
3: air-conditioning device
4: communication pathway
10: touch panel
12: central arithmetic unit
13: drawing unit
14: VRAM
15: display controller
16: display unit
17: communication interface
18: equipment information storage unit
19: drawing object storage unit
20: palette value converter
21*a*, 21*b*: palette table
22: lookup table
23: icon image storage unit
31: operation screen
33 to 39: button image
40: set temperature text image
41: popup image

The invention claimed is:

1. A facility operation display device having a display unit that displays information related to facilities to be operated, comprising:

an interface that receives commands for the facilities;

a converter for converting a first palette value corresponding to the color information of respective pixels in an image displayed by the display unit into a second palette value corresponding to the color information of respective pixels in an image displayed by the display unit in response to commands input into the interface;

a display controller for determining the color information on the basis of the second palette value, and controlling the display unit so as to display the image composed of pixels with the determined color information; and one or a plurality of conversion tables that indicate correspondences between the first palette value and the second palette value, wherein the converter converts the first palette value into the second palette value by referencing the one or plurality of conversion tables, wherein the converter includes a buffer that stores at least a part of the conversion tables, and wherein the first palette value is converted into the second palette value on the basis of information stored in the buffer in the case where information related to the second palette value corresponding to the first palette value is being stored in the buffer.

2. The facility operation display device according to claim 1, wherein the palette value has a smaller number of bits than the color information.

3. The facility operation display device according to claim 1, further comprising:

VRAM that stores the second palette value.

4. The facility operation display device according to claim 1, wherein the converter updates the contents of the buffer according to a given technique.

5. The facility operation display device according to claim 4, wherein the technique is a FIFO technique or an LRU technique.

6. The facility operation display device according to claim 1, wherein the color information includes an RGB value.

7. The facility operation display device according to claim 1, further comprising:

specifier for specifying a conversion method for converting the color information of respective pixels in an image representing a screen displayed by the display unit, wherein the converter converts the color information of the respective pixels constituting an image representing the screen on the basis of the conversion method specified by the specifier, and converts the color information of pixels in respective images of parts disposed on the screen on the basis of the conversion method specified by the specifier.

8. The facility operation display device according to claim 7, further comprising:

manager for managing the screen as an object, and additionally managing the parts disposed on the screen as lower objects belonging to a lower hierarchical level than the object for the screen;

wherein the specifier sets a specific value specifying the conversion method in a property value possessed by the object for the screen managed by the manager, and the converter converts the color information of the pixels in the respective images representing the parts managed as the lower objects on the basis of a property value of an object belonging to a higher hierarchical level than the lower objects.

9. The facility operation display device according to claim 8, wherein the parts are one or more buttons and text areas disposed on the screen.

10. The facility operation display device according to claim 9, wherein the screen includes a window displayed by the display unit and a given area inside the window.

11. A facility operation display device having a display unit that displays information related to facilities to be operated, comprising:

an interface that receives commands for the facilities;

a converter for converting a first palette value corresponding to the color information of respective pixels in an image displayed by the display unit into a second palette value corresponding to the color information of respective pixels in an image displayed by the display unit in response to commands input into the interface;

a display controller for determining the color information on the basis of the second palette value, and controlling the display unit so as to display the image composed of pixels with the determined color information; and a specifier for specifying a conversion method for converting the color information of respective pixels in an image representing a screen displayed by the display unit, wherein the converter converts the color information of the respective pixels constituting an image representing the screen on the basis of the conversion method specified by the specifier, and converts the color information of pixels in respective images of parts disposed on the screen on the basis of the conversion method specified by the specifier.

12. The facility operation display device according to claim 11, wherein the palette value has a smaller number of bits than the color information.

13. The facility operation display device according to claim 11, further comprising:

VRAM that stores the second palette value.

14. The facility operation display device according to claim 11, wherein the converter converts the first palette value into the second palette value according to a given arithmetic operation.

15. The facility operation display device according to claim 11, further comprising:

one or a plurality of conversion tables that indicate correspondences between the first palette value and the second palette value, wherein the converter converts the first palette value into the second palette value by referencing the one or plurality of conversion tables.

16. The facility operation display device according to claim 15, wherein the converter includes a buffer that stores at least a part of the conversion tables, and the first palette value is converted into the second palette value on the basis of information stored in the buffer in the case where information related to the second palette value corresponding to the first palette value is being stored in the buffer.

17. The facility operation display device according to claim 16, wherein the converter updates the contents of the buffer according to a given technique.

18. The facility operation display device according to claim 17, wherein the technique is a FIFO technique or an LRU technique.

19. The facility operation display device according to claim 11, wherein the color information includes an RGB value.

20. The facility operation display device according to claim 19, further comprising:

a manager for managing the screen as an object, and additionally managing the parts disposed on the screen as lower objects belonging to a lower hierarchical level than the object for the screen;

wherein the specifier sets a specific value specifying the conversion method in a property value possessed by the object for the screen managed by the manager, and the converter converts the color information of the pixels in the respective images representing the parts managed as the lower objects on the basis of a property value of an object belonging to a higher hierarchical level than the lower objects.

21. The facility operation display device according to claim 20, wherein the parts are one or more buttons and text areas disposed on the screen.

22. The facility operation display device according to claim 21, wherein the screen includes a window displayed by the display unit and a given area inside the window.

23. An air-conditioning system, comprising:

a facility operation display device having a display unit that displays information related to facilities to be operated, the facility operation display device including:

an interface that receives commands for the facilities;

a converter for converting a first palette value corresponding to the color information of respective pixels in an image displayed by the display unit into a second palette value corresponding to the color information of respective pixels in an image displayed by the display unit in response to commands input into the interface;

a display controller for determining the color information on the basis of the second palette value, and controlling the display unit so as to display the image composed of pixels with the determined color information; and one or a plurality of conversion tables that indicate correspondences between the first palette value and the second palette value, wherein the converter converts the first palette value into the second palette value by referencing the one or plurality of conversion tables, wherein the converter includes a buffer that stores at least a part of the conversion tables, and wherein the first palette value is converted into the second palette value on the basis of information stored in the buffer in the case where information related to the second palette value corresponding to the first palette value is being stored in the buffer.

24. An air-conditioning system, comprising:

a facility operation display device having a display unit that displays information related to facilities to be operated, the facility operation display device including:

an interface that receives commands for the facilities;

a converter for converting a first palette value corresponding to the color information of respective pixels in an image displayed by the display unit into a second palette value corresponding to the color information of respective pixels in an image displayed by the display unit in response to commands input into the interface;

a display controller for determining the color information on the basis of the second palette value, and controlling the display unit so as to display the image composed of pixels with the determined color information; and a specifier for specifying a conversion method for converting the color information of respective pixels in an image representing a screen displayed by the display unit, wherein the converter converts the color information of the respective pixels constituting an image representing the screen on the basis of the conversion method specified by the specifier, and converts the color information of pixels in respective images of parts disposed on the screen on the basis of the conversion method specified by the specifier.

25. A non-transitory computer-readable medium storing a program for causing a controller in a facility operation display device, having a display unit that displays information related to given facilities, to execute a method comprising:

receiving commands for the facilities;

converting a first palette value corresponding to the color information of respective pixels in an image displayed by the display unit into a second palette value corresponding to the color information of respective pixels in an image displayed by the display unit in response to commands input into the interface;

determining the color information on the basis of the second palette value, and controlling the display unit so as to display the image composed of pixels with the determined color information; and indicating, by one or a plurality of conversion tables, correspondences between the first palette value and the second palette value, wherein the first palette value is converted into the second palette value by referencing the one or plurality of conversion tables, wherein a buffer stores at least a part of the conversion tables, and wherein the first palette value is converted into the second palette value on the basis of information stored in the buffer in the case where information related to the second palette value corresponding to the first palette value is being stored in the buffer.

26. A non-transitory computer-readable medium storing a program for causing a controller in a facility operation display device, having a display unit that displays information related to given facilities, to execute a method comprising:

receiving commands for the facilities;

converting a first palette value corresponding to the color information of respective pixels in an image displayed by the display unit into a second palette value corresponding to the color information of respective pixels in an image displayed by the display unit in response to commands input into the interface;

determining the color information on the basis of the second palette value, and controlling the display unit so as to display the image composed of pixels with the determined color information; and specifying a conversion method for converting the color information of respective pixels in an image representing a screen displayed by the display unit, wherein the color information of the respective pixels constituting an image representing the screen is converted on the basis of the conversion method specified, and the color information of pixels in respective images of parts disposed on the screen is converted on the basis of the conversion method specified.

* * * * *